United States Patent
Jonsson et al.

(10) Patent No.: US 7,075,465 B2
(45) Date of Patent: Jul. 11, 2006

(54) COMPARATOR OFFSET CALIBRATION FOR A/D CONVERTERS

(75) Inventors: Bengt Jonsson, Spanga (SE); Christer Jansson, Linkoping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/509,828

(22) PCT Filed: Feb. 24, 2003

(86) PCT No.: PCT/SE03/00297

§ 371 (c)(1),
(2), (4) Date: Mar. 18, 2005

(87) PCT Pub. No.: WO03/084071

PCT Pub. Date: Oct. 9, 2003

(65) Prior Publication Data

US 2005/0219090 A1    Oct. 6, 2005

(30) Foreign Application Priority Data

Apr. 2, 2002  (TW) ............................ 91106646 A (51) Int. Cl.
*H03M 1/10*  (2006.01)
(52) U.S. Cl. ...................................... 341/120; 341/118
(58) Field of Classification Search ................ 341/120, 341/118

See application file for complete search history.

(56) References Cited

U.S. PATENT DOCUMENTS

| 6,163,283 A | 12/2000 | Schofield |
| 6,205,078 B1 * | 3/2001 | Merritt ........................ 365/226 |
| 6,320,426 B1 | 11/2001 | Shih |
| 6,496,129 B1 | 12/2002 | Dedic et al. |
| 6,515,464 B1 * | 2/2003 | Darmawaskita et al. . 324/76.11 |
| 6,720,757 B1 | 4/2004 | Khorram et al. |

FOREIGN PATENT DOCUMENTS

| WO | WO 02069502 A1 | 9/2002 |
| WO | WO 02082660 A1 | 10/2002 |

OTHER PUBLICATIONS

Swedish Patent Office, International Search Report for PCT/SE03/00297, dated May 30, 2003.

* cited by examiner

*Primary Examiner*—Rexford Barnie
*Assistant Examiner*—Joseph Lauture
(74) *Attorney, Agent, or Firm*—Roger Burleigh (57) ABSTRACT

An A/D converter includes at least one comparator array (COMP1–COMP7) for flash A/D conversion of an analog signal. Means (CCU, SW1–SW7) provide, for each comparator in the array, a common reference signal to both comparator input terminals. Means (CCU, DAC1–DAC7) force each compara-tor in the array into the same logical output state. Finally, means (CCU, DAC1–DAC7) adjust the comparator trip-point for each comparator by a ramp signal until the logical output state is inverted.

22 Claims, 8 Drawing Sheets

COMPARATOR OFFSET CALIBRATION FOR A/D CONVERTERS

TECHNICAL FIELD

The present invention relates to analog-to-digital converters, and in particular how to improve the accuracy of the bit-level decisions of such converters.

BACKGROUND

In a high-speed A/D-converter, the response time of the comparator(s) must be extremely short. It is therefore desirable to have a simple comparator circuit in order to reduce its inherent propagation delay. However, simple comparator circuits typically have low accuracy due to comparator offset errors, which makes them unsuitable for high-resolution A/D converters.

Careful circuit and layout design is the first key to low-offset comparators. Mismatch is caused by random variations within the resolution of the manufacturing process. It is a well-known fact that small devices are more sensitive to these random errors, while increasing physical size improves matching [1]. However, a drawback of increasing the physical size of the components is that this usually leads to increased power dissipation. This is true both for scaling of passive components like capacitances, and for active components such as MOS transistors. Even when power dissipation is not an issue, there is a practical limit on the achievable accuracy. By studying the open literature, it seems that a carefully designed comparator may give a precision equivalent to 3–4 bits.

A widely used method to reduce the effect of comparator offset is to put a pre-amplifier in front of the comparator. Assuming that the offset of the pre-amplifier is significantly less than the comparator offset, the effect of the comparator offset is now attenuated by the gain of the pre-amplifier [1]. However, by adding a preamplifier, the response time of the comparator increases with the propagation delay of the pre-amplifier. This increase in response time will significantly reduce the attainable sampling rate.

It has been shown that redundancy can be used for digital correction of A/D sub-converter decision levels in pipeline A/D converters. One common approach is to let the signal range of each pipeline stage overlap the preceding stage by 1-b (i.e., a factor of two). Then the A/D sub-converters need only to be accurate to the stage resolution [2]. However, with the additional requirement of extremely short propagation delay in, for example high-speed pipeline A/D converters, even a 4 or 5-bit flash A/D converter is very difficult to implement. Therefore the manufacturing yield may become very low.

The influence of comparator offset can be reduced by changing the reference levels or by adding a "counter-offset" to the reference voltage. Two prior art solutions are described below. Both approaches alter the reference voltage actually applied to the comparator.

The "reference-tap" method described in [3] assumes that the random offset variation is larger than 1 LSB of the voltage reference ladder. By trying out a few of the neighboring voltage reference taps, the tap that gives the least offset can be found. While conceptually simple, this method has the drawback that offset can only be calibrated to within +/−1 LSB of the reference ladder. This may be enough for a stand-alone flash A/D converter, but when the flash A/D converter is used as a sub-converter, e.g. in a pipeline A/D converter, it is desirable to have a more accurate compensation of the comparator offsets, since a higher-than-necessary comparator accuracy improves the overall performance in many practical implementations.

The "counter-offset voltage" method described in [4, 5] deliberately applies a secondary offset voltage, $V_a$, to balance out the inherent offset of the comparator circuit. A feedback-loop comprising an up/down counter and a switched capacitor network is used to search for, and apply, the appropriate secondary offset voltage. The drawback of this method is that the secondary offset voltage (or trim voltage), $V_a$, which cancels the comparator offset is stored on a capacitor. Therefore the trim voltage needs to be periodically refreshed. In between such refresh instances, the stored voltage is sensitive to glitches, which may alter the stored voltage. The method is also sensitive to glitches during calibration, since switching transients may cause a faulty trim voltage to be stored and used for the duration of a whole refresh cycle.

SUMMARY

An object of the present invention is to improve comparator accuracy in A/D converters without the drawbacks of the prior art solutions, and especially without a significant speed penalty.

This object is achieved in accordance with the attached claims.

Briefly, the present invention calibrates the internal comparator trip-points (where the comparator output switches from 0 to 1) to compensate for comparator offsets. Since the comparators are adjusted internally, no extra propagation delay is introduced. This means that a very high sampling rate may be attained with very simple comparators. On the other hand, it is possible to obtain very high comparator accuracy by using sufficiently small calibration steps.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for the same or similar elements.

The description below will describe the present invention with reference to a pipeline A/D converter. However, it is appreciated that the present invention is not limited to the pipeline A/D converter architecture. It is equally applicable to any architecture using flash A/D converters as a building block. Examples of such architectures are multi-bit Δ–Σ, sub-ranging, folding, and of course stand-alone flash A/D converters.

Figure 1:
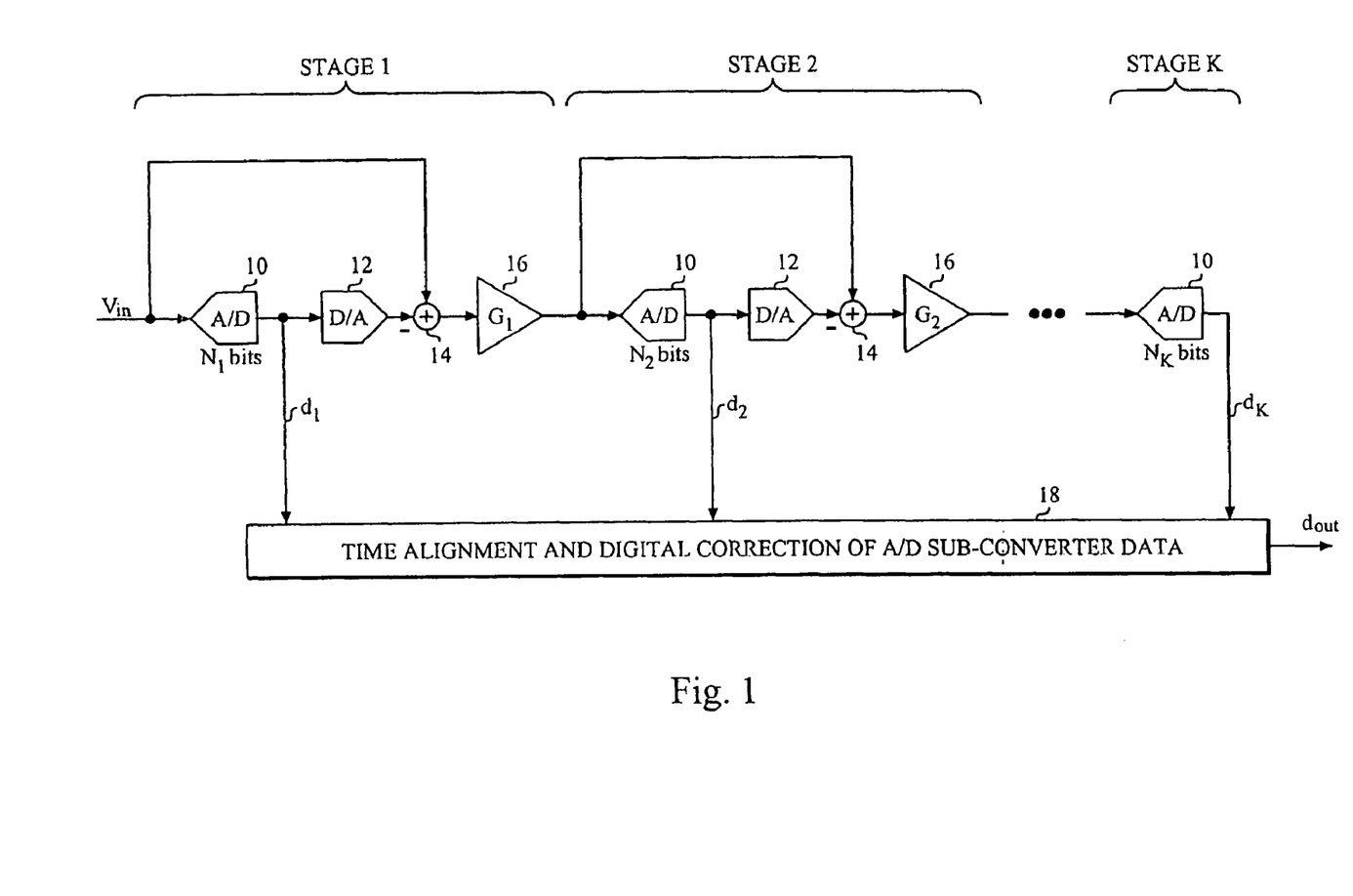
FIG. 1 is a block diagram of a typical pipeline A/D converter.

FIG. 1 is a block diagram of a typical pipeline A/D converter. An N-bit analog-to-digital conversion is performed in two or more stages, each stage extracting $\{N_1, N_2 \ldots N_K\}$ bits of information represented by the digital words $\{d_1, d_2 \ldots d_K\}$, where K is the number of pipeline stages. The first pipeline stage extracts the $N_1$ most significant bits using an $N_1$-bit A/D sub-converter 10. Then the estimated value is subtracted from the analog input signal $V_{in}$ by using a D/A sub-converter 12 and an adder 14, leaving a residue containing the information necessary to extract less significant bits. Usually the residue is amplified by an amplifier 16 having a gain $G_1$ to establish the appropriate signal range for stage 2. These steps are repeated for all K stages, with the exception of the last pipeline stage, which does not need to produce an analog output and therefore has no D/A converter, adder or amplifier, but only an A/D converter 10. The digital words $\{d_1, d_2 \ldots d_K\}$ are then combined to form the digital output word $d_{out}$ in a unit 18 for time alignment and digital correction of A/D sub-converter data.

In order to simplify the following description, it is assumed that an A/D converter stage has a resolution of 3 bits. This number is sufficiently small to be manageable, but is also large enough to illustrate the essential features of a typical case. However, it is appreciated that in general the number of bits may be larger. This is especially the case for a single-stage flash A/D converter, which typically may have a resolution of up to 10 bits.

Figure 2:
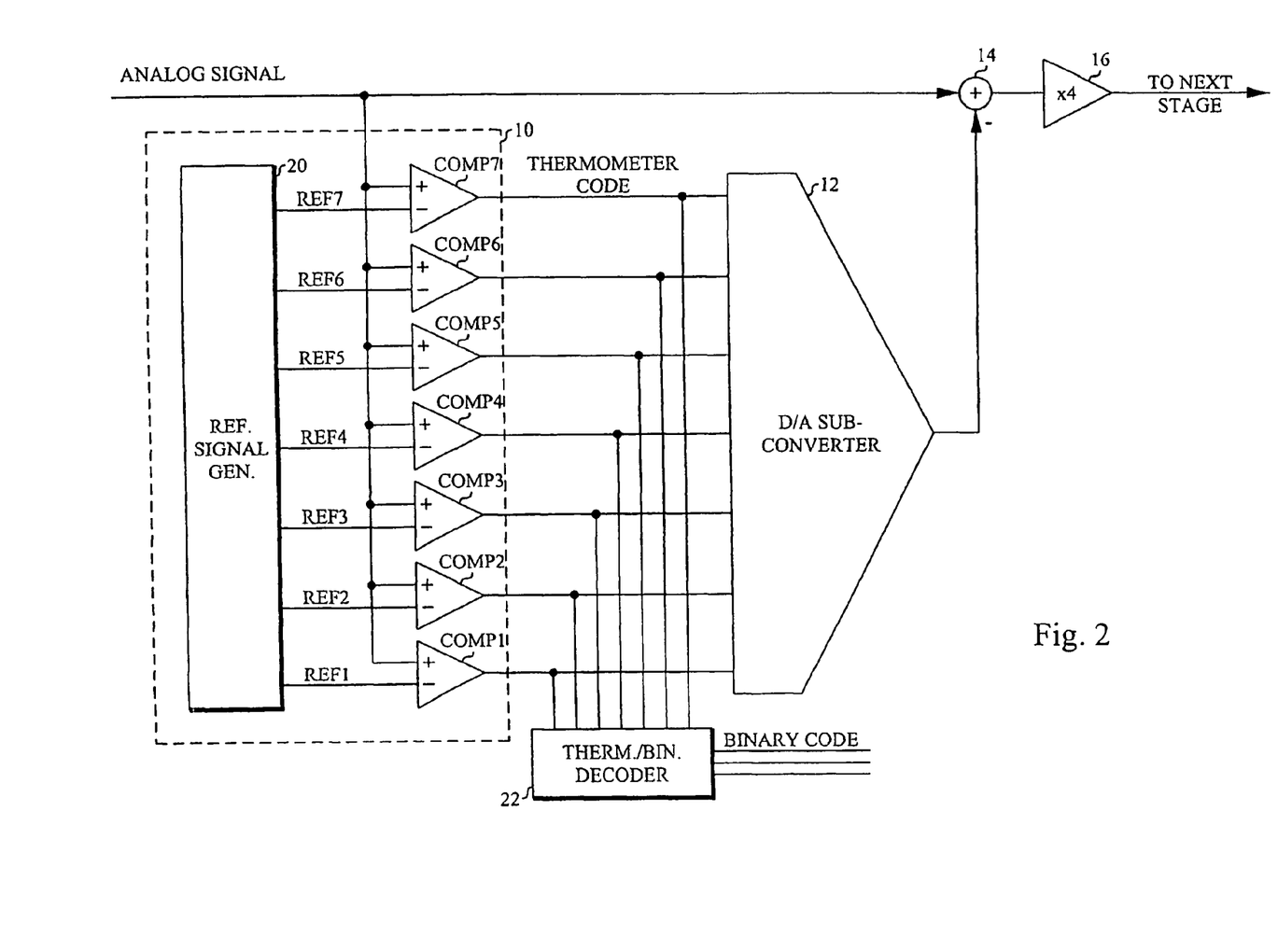
FIG. 2 is a block diagram of a typical stage of the A/D converter in FIG. 1.

FIG. 2 is a block diagram of a typical stage of the A/D converter in FIG. 1. A/D sub-converter 10 includes a number of comparators COMP1–COMP7. One input terminal of each comparator is connected to a corresponding reference voltage REF1–REF7. These reference voltages can be generated by resistive or capacitive division of a global reference voltage in a reference signal generator 20. The other input terminal of each comparator receives the analog input signal (the same signal to each comparator). The output signals TH1–TH7 from the comparators collectively form the digitized value in thermometer code. These signals are forwarded to D/A sub-converter 12 over a thermometer code bus, where they are transformed into a corresponding analog value. This value is subtracted from the original analog value in adder 14, and the residual signal is amplified by a gain equal to 4 in gain element 16.

Figure 3:
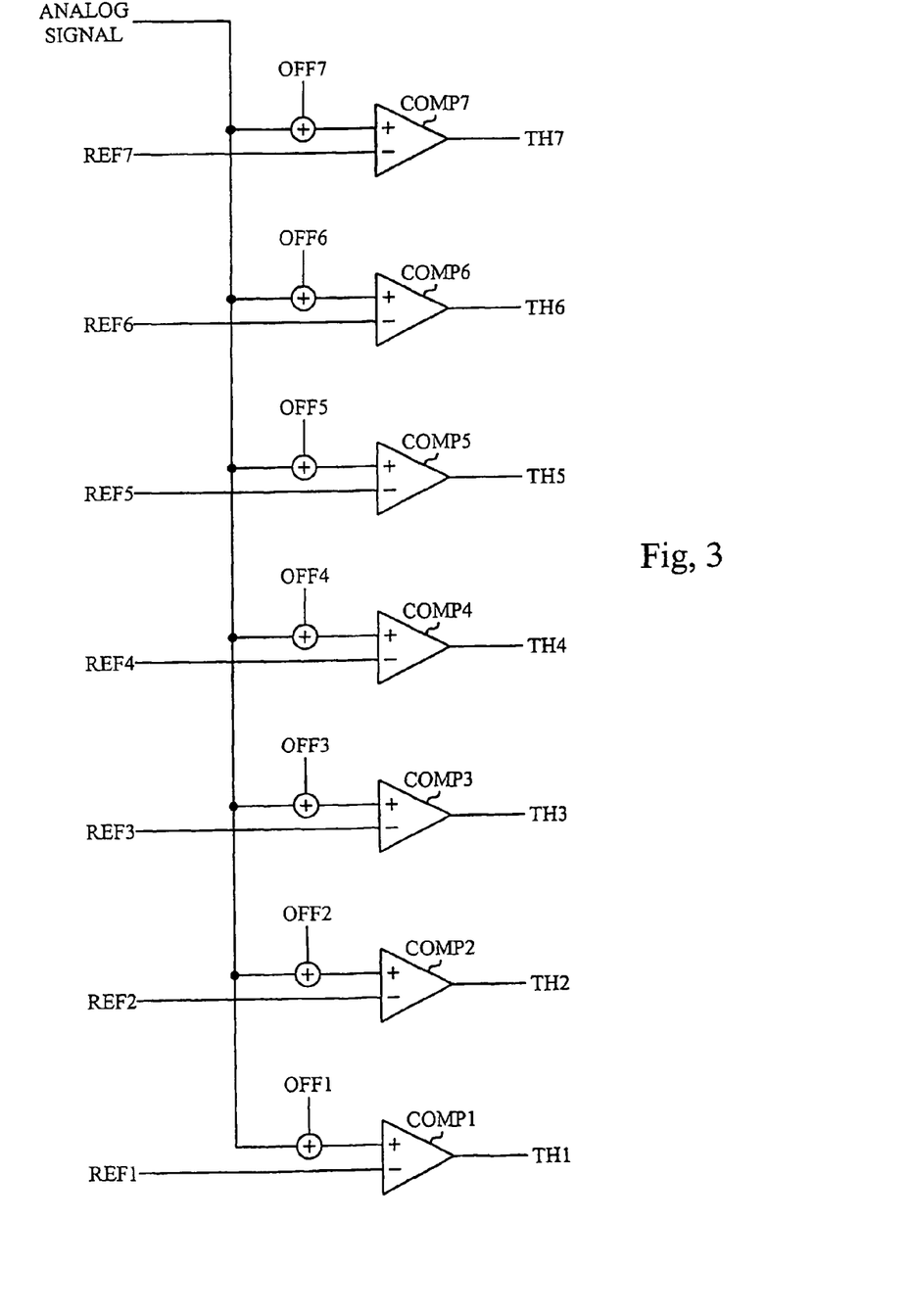
FIG. 3 is a block diagram of a comparator array in a pipeline A/D converter stage.

FIG. 3 is a block diagram of a comparator array in a pipeline A/D converter stage. In such a converter it is necessary to latch the bit-level decisions so that they do not change during the time they are used by the internal D/A converter. A popular approach is to use some kind of regenerative latches. The regenerative latches have the full functionality of comparators, and can therefore be used as such, although their offsets OFF1–OFF7 may be rather high, often larger than the difference voltage between two neighboring reference voltages REF1 . . . REF7. The offsets are mainly due to a combination of device-mismatch and parasitic mismatch, causing the effective trip-points of the latches/comparators to shift from their ideal value (which is typically 0 V). However, the present invention is applicable to more general comparators, although in this specification a simple comparator will be exemplified by a regenerative latch.

Figure 4:
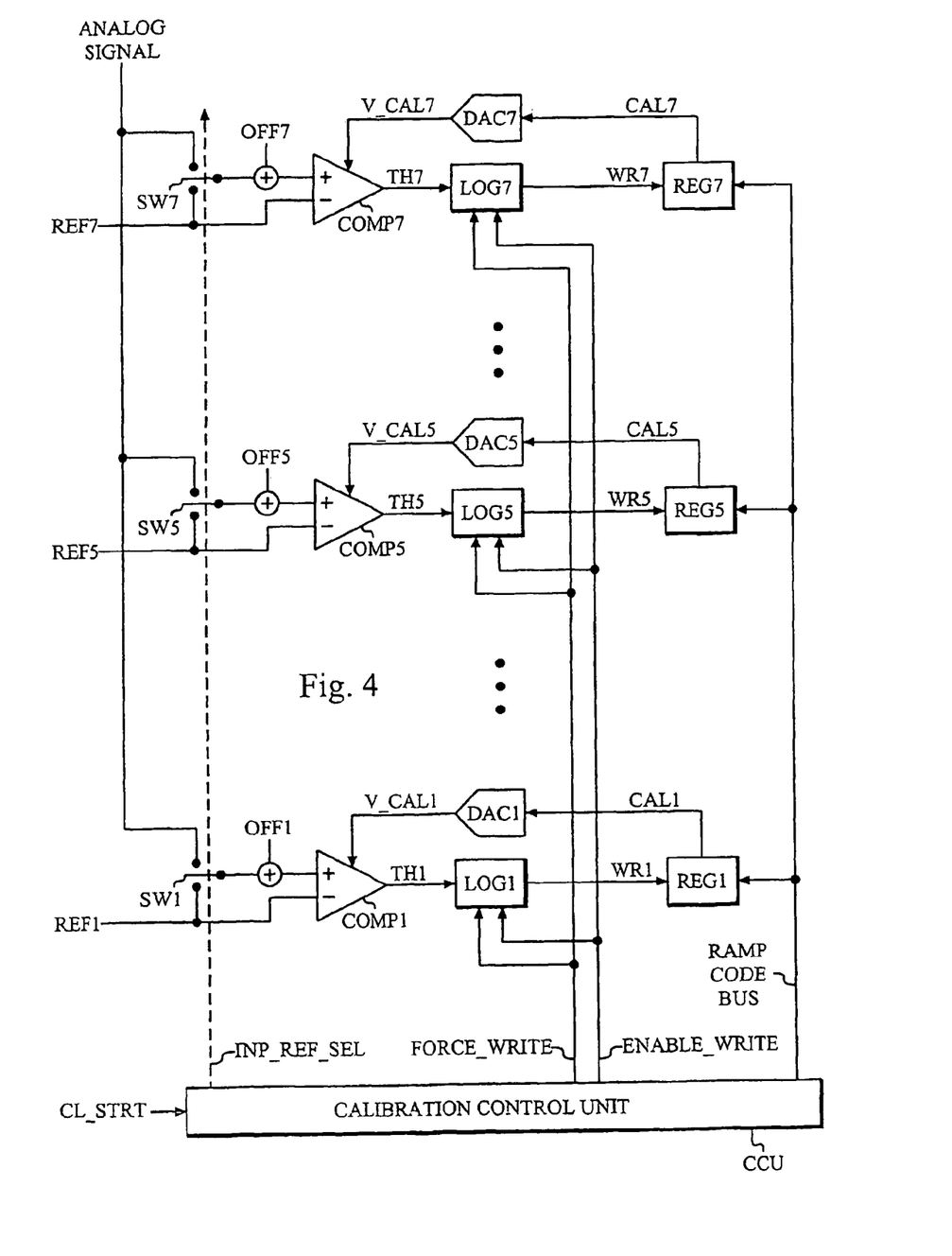
FIG. 4 is block diagram of an A/D converter stage including an exemplary embodiment of a calibration system in accordance with the present invention.

FIG. 4 is an exemplary embodiment of a calibration apparatus in accordance with the present invention. The present invention solves the problem discussed above by calibrating the A/D sub-converter trip points to compensate for comparator offsets. The comparator circuits are modified so that their balance around the trip-points can be adjusted by a control voltage (or current) V_CAL1–V_CAL7. An example of such a comparator is described in [6]. The control voltage is applied through dedicated calibrating D/A converters DAC1–DAC7. Each calibrating D/A converter receives its digital input code from a corresponding register REG1–REG7 storing the offset calibration value CAL1–CAL7. The full-scale range of the calibrating D/A converters DAC1–DAC7 is selected so that it is large enough to balance out any offset within the expected offset range. The lowest voltage V_CALi, i=1 . . . 7, should guarantee that the comparator outputs are all 0 (or 1, depending on whether "positive" or "negative" logic is used), while the highest voltage V_CALi should guarantee a 1 (or 0) at the output. The resolution of the calibrating D/A converters DAC1–DAC7 is selected according to the maximum acceptable comparator offset residue.

A calibration sequence is initiated and controlled by a calibration control unit CCU shared by all comparators COMP1–COMP7 in the array. For the purpose of illustration, a calibration sequence can be described as follows (in FIG. 4 some of the comparator stages have been indicated by dots to enhance the readability of the drawing):

1. The reference voltage REFi, i=1 . . . 7, associated with each comparator is connected to both the positive and negative inputs of the respective comparator. Because of the random offset OFF1–OFF7 of the comparators, the output bits TH1–TH7 are randomly 0 or 1 depending of the signs of OFF1–OFF7.

2. Calibration control unit CCU writes the code MIN (typically 0) to a ramp code bus. All the registers REG1–REG7 are simultaneously forced to store this zero code, thus tipping the balance of each comparator so that all of them have a zero output. This is done by applying a FORCE_WRITE signal to a logic gate LOGi, which controls writing to the corresponding register REGi.

3. An ENABLE_WRITE signal is set to TRUE. The trip-point, and thus the offset calibration value CALi, i=1 . . . 7, is found for all comparators simultaneously by ramping the bus code from MIN to MAX as illustrated in FIG. 5–9.

Figure 6:
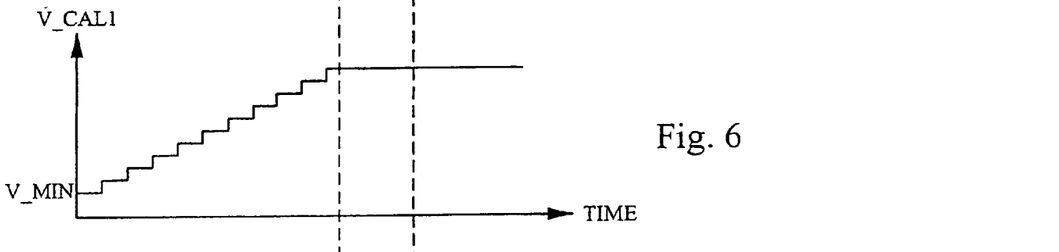
FIG. 6 is a diagram illustrating the behavior of the calibration signal of one of the comparators as the ramp signal increases.
Figure 8:
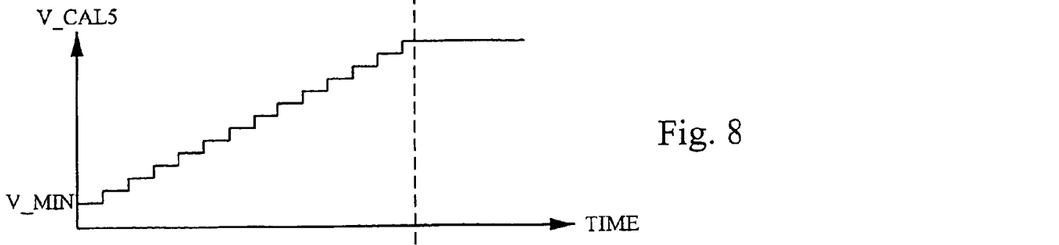
FIG. 8 is a diagram illustrating the behavior of the calibration signal of second comparator as the ramp signal increases.

4. As long as WRITEi=TRUE, each new bus code is stored in the corresponding register REGi, and consequently the calibrating D/A converter output voltage V_CALi is also ramped, as illustrated in FIGS. 6 and 8 for V_CAL1 and V_CAL5, respectively.

5. Eventually, the comparator output THi from each comparator will change from 0 to 1. The corresponding logic gate LOGi detects this value and sets WRITEi=FALSE, which will prevent new codes from being written to register REGi. Thus the current ramp code bus value CALi becomes the digital offset calibration value for comparator i.

Figure 5:
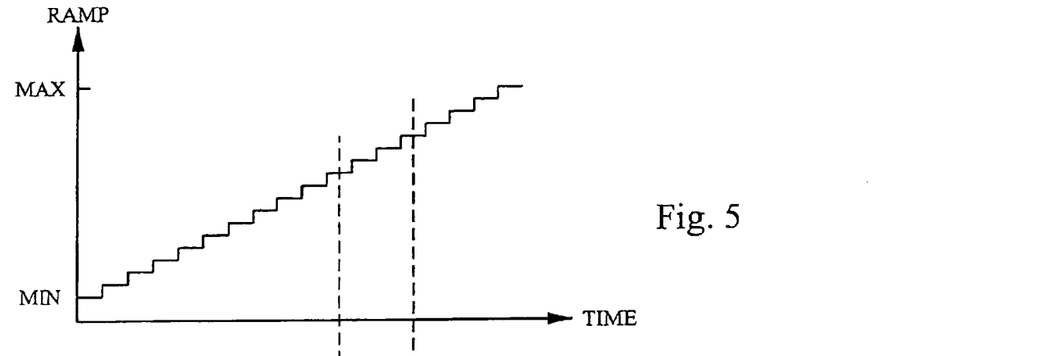
FIG. 5 is a diagram illustrating a ramp signal used to calibrate comparators in accordance with the present invention.
Figure 7:
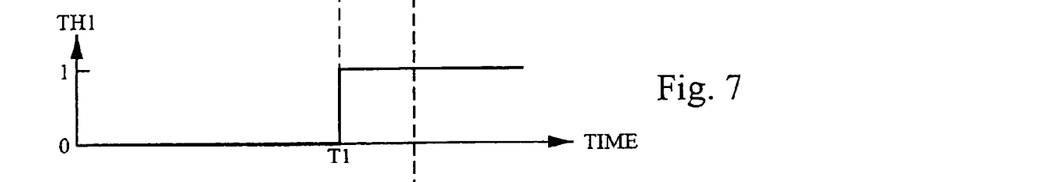
FIG. 7 is a diagram illustrating the behavior of the output signal of one of the comparators as the ramp signal increases.
Figure 9:
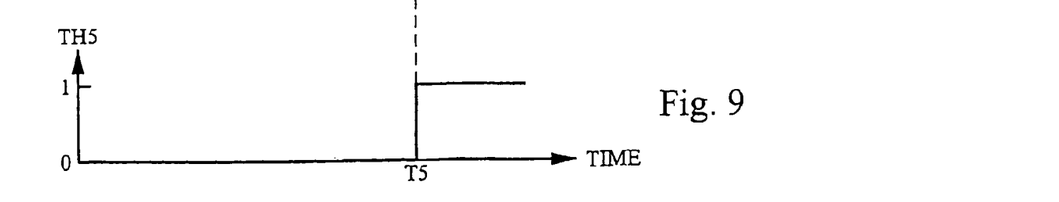
FIG. 9 is a diagram illustrating the behavior of the output signal of the second comparator as the ramp signal increases.

6. The bus code continues to ramp up to MAX (FIG. 5). Somewhere during this ramp, each individual comparator will detect and store the code value which caused the comparator to flip from 0 to 1 as illustrated in FIGS. 7 and 9 (since, as noted above, the full-scale range of the calibrating D/A converters DAC1–DAC7 is selected so that it is large enough to balance out any offset within the expected offset range).

Figure 10:
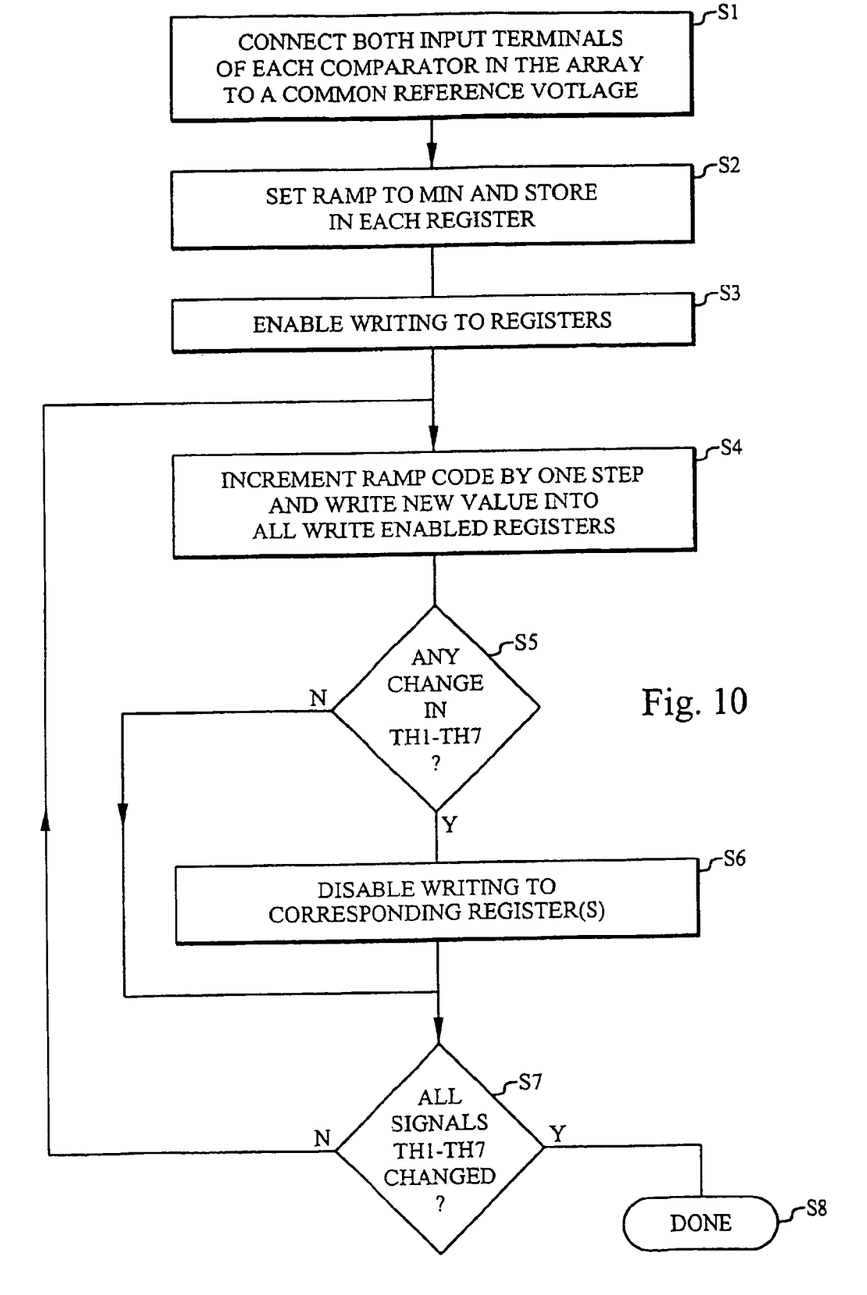
FIG. 10 is a flow chart illustrating an exemplary embodiment of the offset calibration method in accordance with the present invention.

This method is summarized in the flow chart in FIG. 10. Step S1 connects both input terminals of each comparator COMP1–COMP7 in the comparator array to a common reference voltage (which is different for each comparator) to force each comparator to a well defined output state, for example a state corresponding to logical state 0. Step S2 sets the ramp code to MIN and stores this value in each comparator register REG1–REG7. Step S3 enables writing to all registers REG1–REG7. Step S4 increments the ramp code by one step and writes the new value into all write enabled registers. Step S5 tests whether any of the output lines TH1–TH7 have changed state (to logical 1). If this is the case, the corresponding register (or registers) is write protected in step S6, and thereafter the procedure proceeds to step S7. If no output has changed, the procedure proceeds directly to step S7 from step S5. Step S7 tests whether all comparator outputs have changed state. If so, the calibration is finished in step S8. Otherwise, the procedure returns to step S4 to increment the ramp code and write the new value into the remaining write enabled registers.

As noted above, the full-scale range of the calibrating D/A converters DAC1–DAC7 is selected so that it is large enough to balance out any offset within the expected offset range. However, if the unlikely situation arises that there still remain comparators that have not changed output state when the maximum ramp code MAX has been reached, in a slightly modified embodiment this MAX value is used as a calibration value for these comparators. Although not optimal, this value is still better than no offset compensation at all. A similar comment applies to the lower limit. If it is not possible to force a comparator to the logical 0 state in step S1, the ramp code MIN is used as calibration code, and writing to the corresponding register is thereafter disabled.

The described method uses a simple evaluation of the trip-point. No complex evaluation or feedback circuit is needed in the determination of the calibration coefficients. It is possible-even preferable-to calibrate all comparators in parallel.

The proposed method, as described so far, is a foreground calibration scheme. This means that the normal signal flow through the A/D converter is interrupted or redirected during calibration. Calibration can be performed at power-up or when there is no traffic in the system. Prototype experiments indicate that a single calibration at start-up may be sufficient to maintain full system performance. The additional power dissipation required by the calibration implementation can be made very low, since there is no continuous operation running in the background, and the calibrating D/A converters need only output low power DC control voltages to the comparators.

Although the calibration method has been described as a foreground calibration method, it is also feasible to divide it into smaller steps, which may be performed in the background. For example, it is possible to perform the ramping function step by step with normal sampling between each step. During each calibration step the sampled signal may be interpolated or else a low resolution A/D converter may be used during these short time periods. Although such a method would be slightly more complex, it is still feasible in situations where continuous updating of calibration parameters is of interest, for example in applications where temperature or other environmental parameters vary and thereby influence the comparator offsets.

The calibration method described above performs calibration of all comparators of one A/D converter stage in parallel. However, it is also possible to perform calibration of all stages simultaneously by using a common calibration control unit and ramp code bus. On the other hand, it is also possible to individually calibrate the trip-point of each comparator at different points in time.

Furthermore, the adjustment signal was assumed to be linear (ramp signal). However, it is also feasible to use non-linear but monotonically varying "ramp" signals, such as partial sine signals, polynomials, etc. In fact, the shape of the signal is not important, as long as a larger signal value is not generated before a smaller value is generated the first time (assuming that the signal goes from MIN to MAX).

The performance improvements obtained by the present invention will now be illustrated with reference to FIG. 11–13

Figure 11:
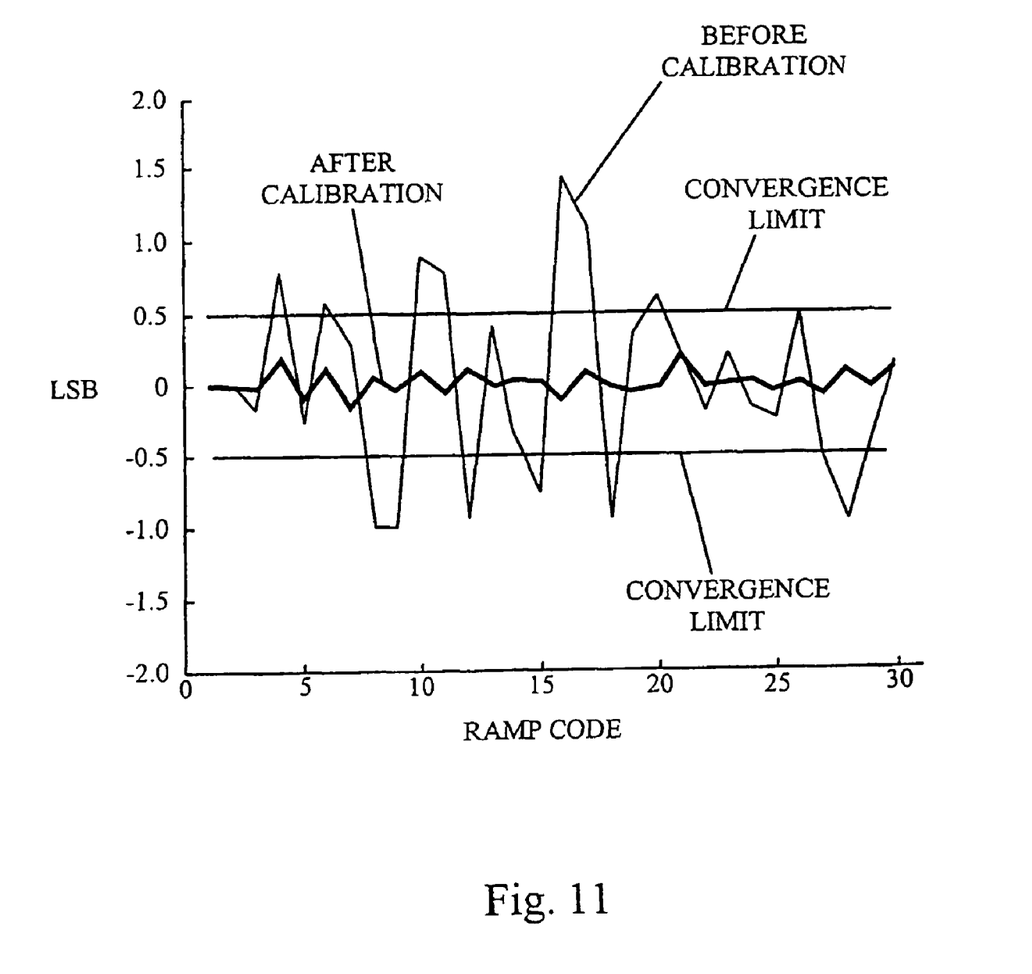
FIG. 11 is a diagram illustrating the improved differential non-linearity (DNL) obtained by the present invention.

FIG. 11 shows the differential non-linearity (DNL) of the first 5-b A/D sub-converter of a pipeline A/D converter before and after calibration according to the invention (it is assumed that the comparators are simple high-speed comparators in both cases). The maximum DNL (+/−0.5 LSB) allowed for correct operation, a.k.a. the convergence limit, is also indicated by the straight horizontal lines. It is seen that without calibration, the DNL errors greatly exceed the convergence limit. With calibration, the DNL is reduced to under +/−0.2 LSB, which is well within the convergence limit.

Figure 12:
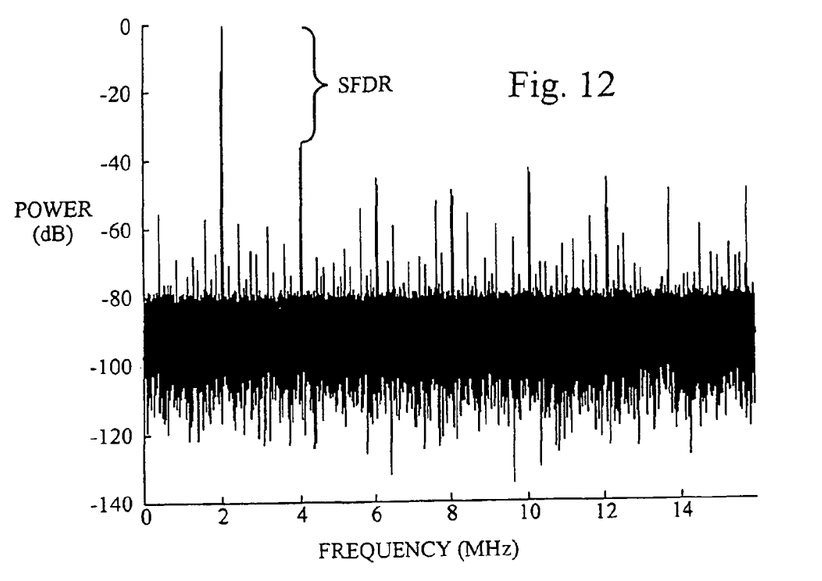
FIG. 12 is a measured power spectrum of an A/D sub-converter without calibration.

FIG. 12 is a measured power spectrum of a sine signal with a frequency of 2 MHz sampled at a sampling rate of 30 MHz by the A/D sub-converter setup used to produce FIG. 11 and without calibration. Since the A/D sub-converter errors exceed the convergence limit of +/−0.5 LSB, the spectrum is severely distorted. The spurious free dynamic range (SFDR) is estimated to about 35 dB.

Figure 13:
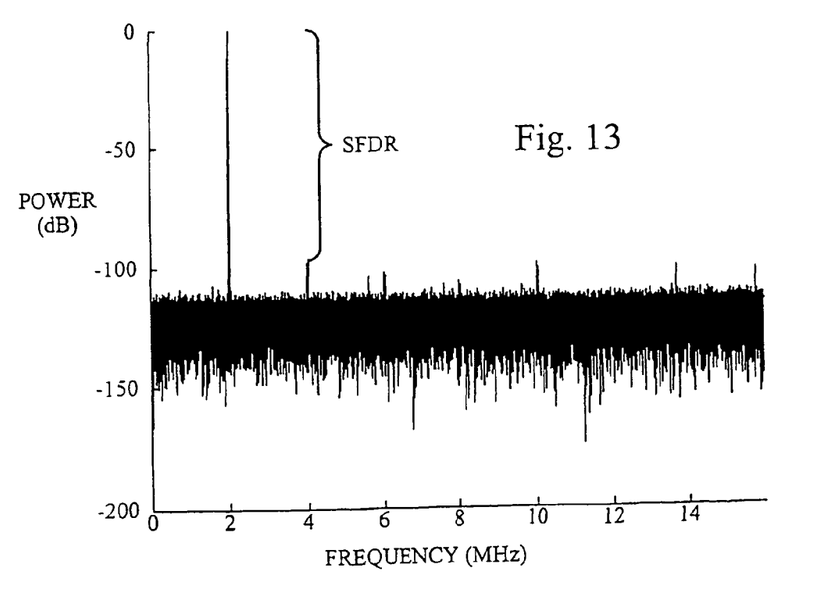
FIG. 13 is a measured power spectrum of an A/D sub-converter calibrated in accordance with the present invention.

FIG. 13 is a measured power spectrum of the same signal as in FIG. 12, but with the A/D sub-converter calibrated in accordance with the present invention. After calibration the A/D sub-converter errors are well below the convergence limit, and SFDR is estimated to about 95 dB, an improvement of about 60 dB.

An alternative to the method described above is to let the code ramp go from highest to lowest value instead of from lowest to highest.

Furthermore, if there is reason to believe that different directions of the ramp may give different calibration coefficient values, a combination of up/down code ramps can be used. If the internal noise level is high, the probability for the comparator to change state too early increases. Then a dual ramp approach may give a more accurate result. In this case the calibration coefficient is the average between the up and down calibration coefficients.

Another way to reduce the influence of noise and glitches is to run several calibration sequences, and take the average of the estimated coefficients.

It is also possible to store the offset or calibration coefficients externally whenever the circuit is powered-down and load them into the circuit again at start-up.

A major advantage of the present invention is that it allows for simpler comparators to be used as building blocks in flash A/D converters or A/D converters using flash A/D sub-converters. By eliminating the need for one or more buffer stages, the propagation delay of the comparators is reduced, and hence the sampling rate can be increased. In accordance with the present invention this is possible with retained accuracy.

The preferred embodiment of the present invention comprises a digital calibration method where offset calibration values are represented and stored digitally. The analog calibration voltage is applied through a dedicated calibrating D/A converter controlled by the digital calibration coefficient. Thus, there is no need for a periodical refresh of the calibration voltage, and the applied calibration voltage cannot be permanently altered by glitches and transients propagating through the circuit. If a glitch occurs, the calibrating D/A converter acts as a digitally controlled voltage source, quickly recovering the correct output voltage.

Analog calibration approaches are also sensitive to glitches during calibration. In a digital approach, such as the present invention, averaging of estimated calibration coefficients could be employed to reduce the effects of occasional glitches, as well as a permanently noisy environment.

It will be understood by those skilled in the art that various modifications and changes may be made to the present invention without departure from the scope thereof, which is defined by the appended claims.

REFERENCES

[1] P. E. Allen, D. R. Holberg, *CMOS Analog Circuit Design*, Holt, Rinehart and Winston, 1987.
[2] S. H. Lewis, and P. R. Gray, "A Pipelined 5-Msample/s 9-bit Analog-to-Digital Converter", *IEEE J. Solid-State Circ.*, pp. 954–961, Vol. SC-22, No. 12, December 1987, IEEE.
[3] G. F. Gross, Jr., T. R. Viswanathan, "Comparator-Offset Compensating Converter", U.S. Pat. No. 5,696,508.
[4] R. Croman, M. Goldenberg, J. P. Hein, "Method and Circuit for Calibration of Flash Analog to Digital Converters", U.S. Pat. No. 5,990,814.
[5] M. M. Kostelnik, R. Croman, M. Goldenberg, "Offset Calibration of Flash ADC Array", U.S. Pat. No. 6,084,538.
[6] Zigiang Gu and W, Martin Snelgrove, "A Novel Self-Calibrating Scheme For Video-Rate 2-Step Flash Analog-to-Digital Converter", *IEEE International Symposium on Circuits and Systems*, Vol. 4, pp. 601–604, 1992.

The invention claimed is:

1. A comparator offset calibration method for A/D converters, comprising the steps of:
   providing, for each comparator in a comparator array, a common reference signal to both comparator input terminals;
   forcing each comparator in said array into the same predetermined logical output state; and
   adjusting, for each comparator in said array, the comparator trip-point until the logical output state is inverted; and,
   adjusting each comparator trip-point by a monotonically varying signal.

2. A comparator offset calibration method for A/D converters, comprising the steps of:
   providing, for each comparator in a comparator array, a common reference signal to both comparator input terminals;
   forcing each comparator in said array into the same predetermined logical output state; and
   adjusting, for each comparator in said array, the comparator trip-point until the logical output state is inverted; and,
   simultaneously adjusting all comparators in said array by a common ramp signal.

3. A comparator offset calibration method for A/D converters, comprising the steps of:
   providing, for each comparator in a comparator array, a common reference signal to both comparator input terminals;
   forcing each comparator in said array into the same predetermined logical output state; and
   adjusting, for each comparator in said array, the comparator trip-point until the logical output state is inverted; and,
   D/A converting, for each comparator in said array, a digital ramp signal into an analog trip-point adjustment signal.

4. The method of claim 3, further comprising the step of storing, for each comparator in said array, an offset calibration coefficient representing the digital ramp signal value that inverts its logical output state.

5. The method of claim 4, further comprising the step of storing, for each comparator in said array, said offset calibration value externally at A/D converter power-down for later retrieval at A/D converter startup.

6. The method of claim 3, further comprising the step of storing, for each comparator in said array, an offset calibration coefficient representing the average of an increasing digital ramp signal value that inverts its logical output state and a decreasing digital ramp signal value that inverts its logical output state.

7. The method of claim 3, further comprising the steps of:
   repeating, for each comparator in said array, said adjustment step; and
   storing, for each comparator in said array, an offset calibration coefficient representing the average of several digital ramp signal values that invert its logical output state.

8. A comparator offset calibration system for A/D converters, comprising:
   means for providing, for each comparator in a comparator array, a common reference signal to both comparator input terminals;
   means for forcing each comparator in said array into the same predetermined logical output state;
   means for adjusting, for each comparator in said array, the comparator trip-point until the logical output state is inverted; and.
   means for adjusting each comparator trip-point by a monotonically varying signal.

9. A comparator offset calibration system for A/D converters, comprising:
   means for providing, for each comparator in a comparator array, a common reference signal to both comparator input terminals;
   means for forcing each comparator in said array into the same predetermined logical output state;

means for adjusting, for each comparator in said array, the comparator trip-point until the logical output state is inverted; and, means for simultaneously adjusting all comparators in said array by a common ramp signal.

10. A comparator offset calibration system for A/D converters, comprising:

means for providing, for each comparator in a comparator array, a common reference signal to both comparator input terminals;

means for forcing each comparator in said array into the same predetermined logical output state;

means for adjusting, for each comparator in said array, the comparator trip-point until the logical output state is inverted; and, means for D/A converting, for each comparator in said array, a digital ramp signal into an analog trip-point adjustment signal.

11. The system of claim 10, further comprising registers for storing, for each comparator in said array, an offset calibration coefficient representing the digital ramp signal value that inverts its logical output state.

12. The system of claim 11, further comprising means for storing, for each comparator in said array, said offset calibration value externally at A/D converter power-down for later retrieval at A/D converter startup.

13. The system of claim 10, further comprising registers for storing, for each comparator in said array, an offset calibration coefficient representing the average of an increasing digital ramp signal value that inverts its logical output state and a decreasing digital ramp signal value that inverts its logical output state.

14. The system of claim 10, further comprising:

means for repeating, for each comparator in said array, said adjustment step; and registers for storing, for each comparator in said array, an offset calibration coefficient representing the average of several digital ramp signal values that invert its logical output state.

15. An A/D converter including at least one comparator array for flash A/D conversion of an analog signal, comprising:

means for providing, for each comparator in said array, a common reference signal to both comparator input terminals;

means for forcing each comparator in said array into the same predetermined logical output state;

means for adjusting, for each comparator in said array, the comparator trip-point until the logical output state is inverted; and, means for adjusting each comparator trip-point by a monotonically varying signal.

16. An A/D converter including at least one comparator array for flash A/D conversion of an analog signal, comprising:

means for providing, for each comparator in said array, a common reference signal to both comparator input terminals;

means for forcing each comparator in said array into the same predetermined logical output state:

means for adjusting, for each comparator in said array, the comparator trip-point until the logical output state is inverted; and, means for simultaneously adjusting all comparators in said array by a common ramp signal.

17. An A/D converter including at least one comparator array for flash A/D conversion of an analog signal, comprising:

means for providing, for each comparator in said array, a common reference signal to both comparator input terminals;

means for forcing each comparator in said array into the same predetermined logical output state;

means for adjusting, for each comparator in said array, the comparator trip-point until the logical output state is inverted; and, means for D/A converting, for each comparator in said array, a digital ramp signal into an analog trip-point adjustment signal.

18. The converter of claim 17, further comprising registers for storing, for each comparator in said array, an offset calibration coefficient representing the digital ramp signal value that inverts its logical output state.

19. The converter of claim 18, further comprising means for storing, for each comparator in said array, said offset calibration value externally at A/D converter power-down for later retrieval at A/D converter startup.

20. The converter of claim 17, further comprising registers for storing, for each comparator in said array, an offset calibration coefficient representing the average of an increasing digital ramp signal value that inverts its logical output state and a decreasing digital ramp signal value that inverts its logical output state.

21. The converter of claim 17, further comprising means for repeating, for each comparator in said array, said adjustment step; and registers for storing, for each comparator in said array, an offset calibration coefficient representing the average of several digital ramp signal values that invert its logical output state.

22. An A/D converter including at least one comparator array for flash A/D conversion of an analog signal, comprising:

means for providing, for each comparator in said array, a common reference signal to both comparator input terminals:

means for forcing each comparator in said array into the same predetermined logical output state; and, means for adjusting, for each comparator in said array, the comparator trip-point until the logical output state is inverted;

wherein the comparators in said array comprise regenerative latches.

* * * * *

UNITED STATES PATENT AND TRADEMARK OFFICE
CERTIFICATE OF CORRECTION

PATENT NO. : 7,075,465 B2  Page 1 of 1
APPLICATION NO. : 10/509828
DATED : July 11, 2006
INVENTOR(S) : Jonsson et al.

It is certified that error appears in the above-identified patent and that said Letters Patent is hereby corrected as shown below:

In Column 8, Line 58, in Claim 8, delete "and." and insert -- and, --, therefor.

Signed and Sealed this

Eighteenth Day of December, 2007

JON W. DUDAS
*Director of the United States Patent and Trademark Office*